United States Patent
Arikado et al.

(10) Patent No.: US 6,237,219 B1
(45) Date of Patent: *May 29, 2001

(54) METHOD OF MOUNTING CONDUCTIVE BALL

(75) Inventors: Kazuo Arikado; Teruaki Kasai; Shinji Sasaguri, all of Fukuoka; Norifumi Eguchi, Saga, all of (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/264,160

(22) Filed: Mar. 5, 1999

(30) Foreign Application Priority Data

Mar. 5, 1998 (JP) .................................................. 10-053227
May 8, 1998 (JP) .................................................. 10-125702

(51) Int. Cl.[7] ...................................................... H01R 9/00
(52) U.S. Cl. ................................. 29/843; 29/430; 29/743; 228/41; 228/245
(58) Field of Search ............................. 29/843, 430, 559, 29/743, 840; 228/41, 180.22, 245, 256; 414/156, 620, 627, DIG. 38

(56) References Cited

U.S. PATENT DOCUMENTS

| | | | |
|---|---|---|---|
| 4,772,125 | * | 9/1988 | Yoshimura et al. ................... 356/237 |
| 4,851,902 | * | 7/1989 | Tezuka et al. ......................... 358/101 |
| 4,871,110 | * | 10/1989 | Fukasawa et al. .................... 228/245 |
| 4,910,757 | * | 3/1990 | Kiyasu et al. .......................... 378/53 |
| 5,410,807 | * | 5/1995 | Bross et al. ............................ 29/843 |
| 5,445,313 | * | 8/1995 | Boyd et al. ........................ 228/248.1 |
| 5,467,913 | * | 11/1995 | Namekawa et al. ................... 228/41 |
| 5,493,594 | * | 2/1996 | Hamada et al. ........................ 378/34 |
| 5,615,823 | * | 4/1997 | Noda et al. ........................... 228/103 |
| 5,657,528 | * | 8/1997 | Sakemi et al. ......................... 29/430 |
| 5,831,247 | * | 11/1998 | Hidaka ................................. 219/388 |
| 5,839,191 | * | 11/1998 | Economy et al. ..................... 29/843 |
| 5,983,490 | * | 11/1999 | Sakemi ................................... 29/833 |
| 6,013,899 | * | 1/2000 | Eguchi et al. ....................... 219/388 |
| 6,031,225 | * | 2/2000 | Stern et al. .......................... 250/235 |

FOREIGN PATENT DOCUMENTS 8-97218 * 8/1996 (JP) .

\* cited by examiner

*Primary Examiner*—Carl J. Arbes
*Assistant Examiner*—Minh Trinh
(74) *Attorney, Agent, or Firm*—Ratner & Prestia

(57) ABSTRACT

In a mounting apparatus for mounting conductive ball where a conductive ball 2 is picked up by vacuum to a suction hole 31a formed in the bottom of a suction head 31 for mounting on a workpiece, a reference wave form that represents the amount of light detected at a light detector 43b when a suction head 31 is sucking a conductive ball 2 rightly in the normal state is compared with a wave form detected at the light detector 43b when actually mounting the conductive ball; also a reference wave form detected at the light detector 43b when there is no conductive ball 2 at all on the suction head 31 is compared with a wave form detected at the light detector 43b after mounting of the conductive ball is finished. Through the above described processing, errors in the light interruption that stem from a tilted suction head 31 and machining errors during processing of suction holes 31 are eliminated, and the existence, or non-existence, of the conductive ball 2 is detected at a high accuracy level.

3 Claims, 14 Drawing Sheets

F I G. 6 (a)
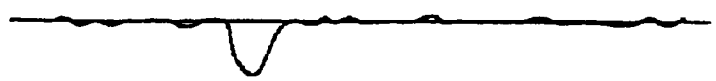
F I G. 6 (b)
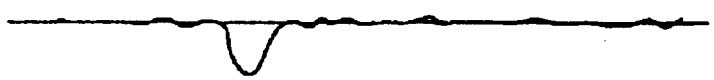
F I G. 7
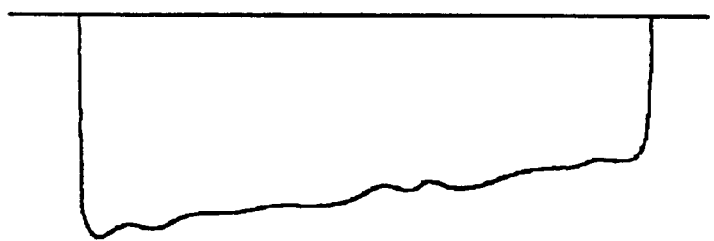

F I G. 8
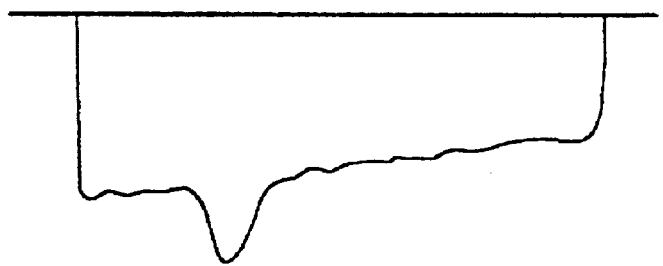
F I G. 9
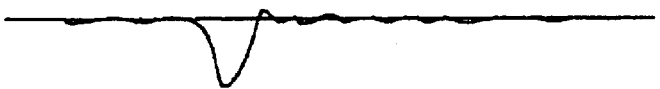
F I G. 10
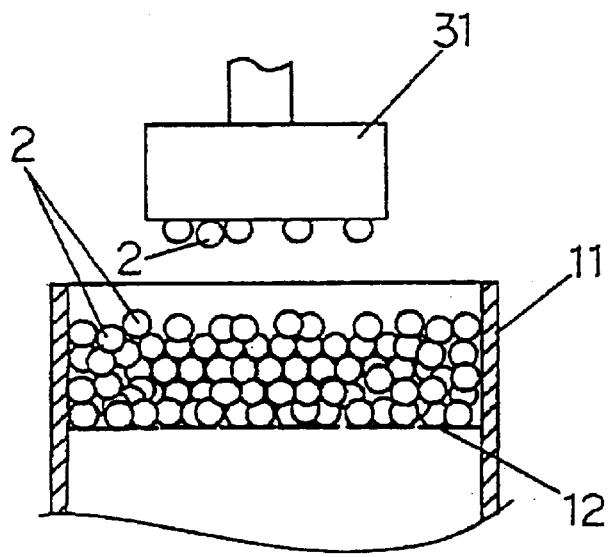

METHOD OF MOUNTING CONDUCTIVE BALL

FIELD OF THE INVENTION

The present invention relates to a mounting apparatus for mounting conductive balls, for example solder balls, on a workpiece, and the method.

BACKGROUND OF THE INVENTION

Solder balls and the like conductive balls are often used in manufacturing the electronic components with bump; for example, a flip chip, a BGA (Ball Grid Array), etc. Suction head is a popular means for mounting the conductive balls on a chip, a substrate and other such workpieces.

Conductive balls kept in a vessel are picked up by a suction head having a number of suction holes provided in the bottom. Then the suction head moves to a place above a workpiece to have the conductive balls mounted on electrode of the workpiece. With this method, a number of balls can be carried to and mounted at once on a workpiece at a high operating efficiency.

In the above described mounting method using a suction head, however, the occurrence of a pickup error and a placing error with the conductive balls are not negligible. Namely, when a suction head is lowered to a dispensing vessel where a number of conductive balls are stored, the suction head does not always pick the conductive balls up rightly for sure, one conductive ball at each of the suction holes. For example, there may be a case where a plurality of conductive balls are sucked to by vacuum under one suction hole forming a chain of balls or a conductive ball is sticking on the bottom surface at a place other than the suction hole. The suction head goes up even if the sucking status remains as described above.

When a suction head is lowered on a workpiece to mount the conductive ball by releasing the sucking vacuum, it can not always be expected for sure that each and all of the conductive balls fall off the suction head to drop on the workpiece. Some of the conductive balls sometimes remain staying on the bottom surface of suction head even after it is lifted.

For detecting the existence of such redundant conductive ball sticking to the surface of suction head and such conductive ball still remaining on the suction head even after a mounting process is finished, there has been a detection system at work using a combination of a light sensor and a laser beam or the like light source. The above detection system recognizes the existence, or non-existence, of a conductive ball by making use of a variation in the amount of light received by the light sensor due to an interruption caused by a ball locating in the path of a light projected from the light source.

However, there are following problems in the above described detection system. The problems come from the machining errors during manufacture of a suction tool or the assembly errors thereof, and the level of precision during machining process for the suction hole. If there is a tilt with the bottom surface of a suction tool caused, for example, by a fabrication error, the bottom surface may not be precisely in parallel with the optical axis of a light sensor; in such a case, some difference may be caused in the interruption of projected light by a conductive ball depending on a place at which the conductive ball is being sucked to. If a wave form representing the amount of light received at the light sensor which exhibits a conductive ball under such a state is compared as it is with a threshold value for the purpose of judgement, the result of comparison may not always indicate correct status. It may misjudge the existence, or non existence, of the conductive ball. If there is a dispersion in the accuracy of machining for the tapered depth of the suction holes, then the height of the conductive balls being sucked to the suction holes may not be uniform. A judgement error may be induced likewise, also in this case.

SUMMARY OF THE INVENTION

The present invention aims to present an apparatus and the method for mounting conductive balls, in which the existence, or non-existence, of the conductive ball is detected at a high accuracy level.

A mounting apparatus for mounting conductive balls in accordance with a first mode of the present invention comprises a ball feeder for keeping conductive balls, a location setting device for setting a workpiece to a right place to be mounted with the conductive balls, a suction head comprising a suction hole provided in the bottom surface for sucking the conductive ball, a light sensor comprising a light source and a light detector, a transfer device for relatively transferring the suction head and the light sensor so as the bottom surface of said suction head passes through a space between said light source and light detector, a reference wave form memory for storing a first reference wave form that represents the variation in the amount of light detected at the light detector during the time when the suction head carrying the conductive balls rightly sucked to in a normal state passes through the space between the light source and the light detector, a read-out wave form memory for storing a first read-out wave form that represents the variation in the amount of light detected at the light detector before mounting of the conductive ball, and a control section for judging the existence, or non-existence, of the conductive ball on the bottom surface of suction head by comparing the first read-out wave form with said first reference wave form.

A mounting apparatus for mounting conductive balls in accordance with a second mode of the present invention comprises, in place of the reference wave form memory of the first mode storing the first reference wave form, a reference wave form memory for storing a second reference wave form that represents the variation in the amount of light detected at the light detector during the time when the suction head passes through the space between the light source and the light detector without carrying any conductive ball; in place of the read-out wave form memory storing the first read-out wave form, a read-out wave form memory for storing a second read-out wave form that represents the variation in the amount of light detected at the light detector after the conductive balls are actually mounted, and a control section for judging the existence, or non-existence, of the conductive ball on the bottom surface of suction head by comparing the second read-out wave form with the second reference wave form.

A mounting apparatus for mounting conductive balls in accordance with a third mode of the present invention comprises, in place of the reference wave form memory of the first mode, a reference peak value memory for storing data on peak value of reference wave form that represents the variation in the amount of light detected at the light detector during the time when the suction head passes through the space between the light source and the light detector carrying the conductive ball rightly sucked to in a normal state; in place of the read-out wave form memory, a comparative peak value memory for storing data on peak value of wave form that represents the variation in the amount of light detected at the light detector before the conductive ball is actually mounted, and a control section for judging the existence, or non-existence, of the conductive ball on the bottom surface of suction head by comparing the data on peak value with the data on peak value of the reference wave form.

As described in the above, an invented mounting apparatus detects the existence, or non-existence, of conductive ball at a high accuracy level by comparing, respectively, a reference wave form, or data on peak value of the reference wave form, with a wave form obtained when actually mounting the conductive ball, or data on peak value of the wave form. In this way, possible errors that could be caused by a tilt of the suction head, and a light interruption error which stems from machining errors during processing of suction holes, etc. are eliminated.

BRIEF DESCRIPTION OF THE DRAWINGS

FIG. 4(a), FIG. 4(b), FIG. 5(a), FIG. 5(b), FIG. 6(a), FIG. 6(b), FIG. 7, FIG. 8 and FIG. 9 show, respectively, the inspection wave forms exhibited by the mounting apparatus.

FIG. 10 is a sectional view showing part of a ball feeder of the mounting apparatus.

Figure 1:
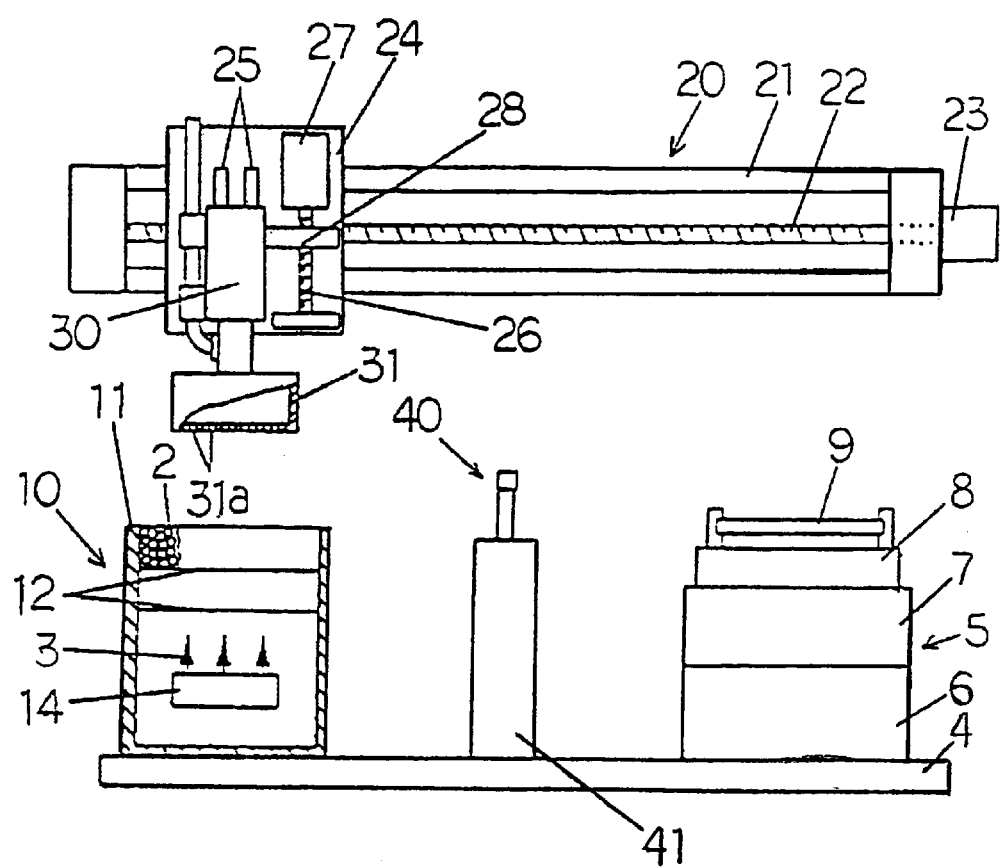
FIG. 1 is a front view of a mounting apparatus for mounting conductive balls in accordance with a first exemplary embodiment of the present invention.
Figure 2:
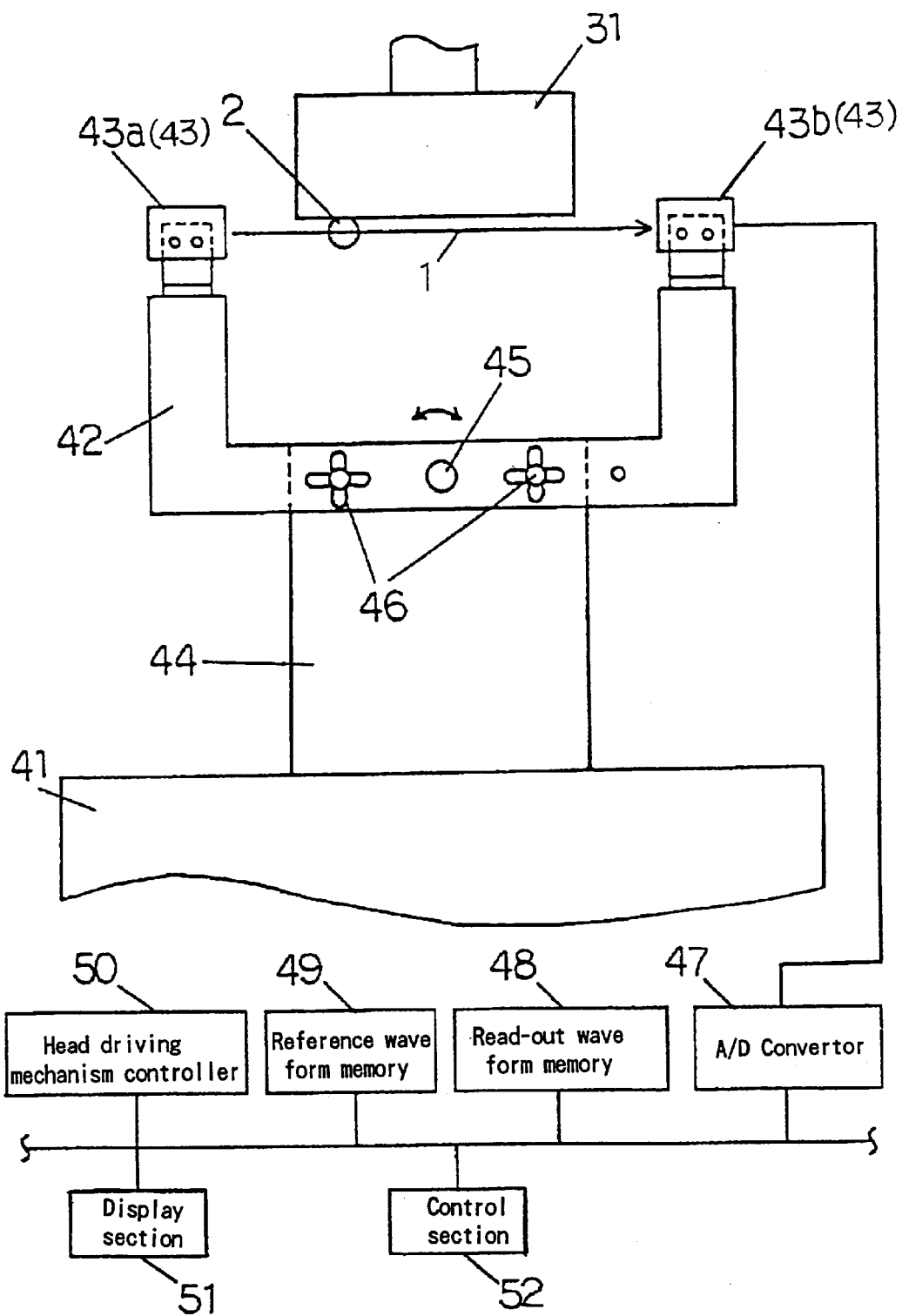
FIG. 2 is a side view of an inspecting section of the mounting apparatus of FIG. 1.

DESCRIPTION OF THE PREFERRED EMBODIMENTS (Embodiment 1)

A mounting apparatus in accordance with a first exemplary embodiment of the present invention is described below referring to the drawings FIG. 1 through FIG. 10.

In the first place, an overall structure of the conductive ball mounting apparatus is described with reference to FIG. 1. A location setting table 5 is provided as means for determining location on a machine bed 4. The location setting table 5 is formed of a Y table 6 and an X table 7. A holder 8 is provided on the X table 7 for holding a workpiece 9. The location of workpiece 9 is determined by moving the location setting table 5. The means for determining location may be constituted instead by providing a table for holding the workpiece 9 as a fixed member and moving a suction head, to be described later, on a horizontal plane in X and Y directions relative to the workpiece 9.

A ball feeder 10 for feeding conductive balls 2 is provided on the machine bed 4 at an end opposite to the location setting table 5. The ball feeder 10 is consisted of a ball vessel 11; within which vessel 11, a mesh plate 12 is provided horizontally in plural layers. The mesh plate 12 is provided with a great many number of through holes, the size of the through hole not allowing the conductive ball 2 to pass through. The conductive balls 2 are stored on the uppermost layer of the mesh plate 12. At the bottom of the ball vessel 11, a nozzle 14 is provided, which nozzle is coupled with a gas supply source (not shown). By supplying a gas to the nozzle 14, the conductive balls 2 are agitated to get a mobility, by the gas blown upward from the nozzle 14 and reaching the layer of conductive balls 2 passing through the through holes of mesh plate 12.

Description is made on a suction head 31 on which the conductive ball 2 is loaded. In FIG. 1, a transfer device 20 moves the suction head 31 for a span between the ball feeder 10 and the location setting table 5. The suction head 31 is held on a block 30. There are a plurality of suction holes 31a in the bottom of the suction head 31. The block 30 is attached to a vertical guide rail 25 provided in the front face of a bracket 24 to be freely movable ups and downs.

The block 30 is provided with a nut 28 made integrally together, which nut is engaged with a vertical screw bolt 26. So, if the screw bolt 26 is revolved in a forward, or reverse, direction as the result of forward, or reverse, revolution of a Z-axis motor 27, the suction head 31 makes up-down movement guided by the guide rail 25. Thus the Z-axis motor 27 and the screw bolt 26 constitute means for moving the suction head 31 ups and downs.

The bracket 24 is provided with a nut(not shown) in the opposite face, which nut is engaged with a horizontal screw bolt 22 which is supported by a holding table 21. So, if the screw bolt 22 is revolved in a forward, or reverse, direction as the result of forward, or reverse, revolution of an X-axis motor 23, the suction head 31 held by the bracket 24 makes a horizontal motion within a span between the location setting table 5 and the ball feeder 10.

An inspecting section 40 is provided on the machine bed 4 at a side of the ball feeder 10, ref. FIG. 1. The inspecting section 40 inspects whether there is a redundant conductive ball 2 sticking on the bottom surface of suction head 31, and whether there is a conductive ball 2 still remaining on the bottom surface of suction head 31 after the mounting operation is finished. The inspecting section 40 is described below referring to FIG. 2. A fixing stand 44 is provided on a machine bed 41, on which stand a sensor bracket 42 is attached rotatably around a pin 45, or fixed fulcrum. The sensor bracket 42 is fixed to the fixing stand 44 by screwing a fixing bolt 46 provided at both sides of the pin 45 tight. Both ends of the bracket 42 are bent; to stand upright; on the top part of which, a light source 43a of light sensor 43 and a light detector 43b of light sensor 43 are provided respectively.

The light detector 43b is connected to an A/D converter 47. The A/D converter 47 converts analog data representing the amount of light received by the light detector 43b into digital data. A read-out wave form memory 48 stores a first read-out wave form which represents the variation in the amount of light detected at the light detector 43*b* when the conductive balls are to be mounted and a second read-out wave form which represents the variation in the amount of light detected at the light detector 43*b* after the conductive balls are mounted. A reference wave form memory 49 stores a first reference wave form detected at the light detector 43*b* which represents a state where the suction head 31 is loaded with the conductive ball 2 being sucked to rightly in a normal state and a second reference wave form detected at the light detector 43*b* which represents a state where the suction head 31 is not loaded with any conductive ball 2 on the bottom surface.

A head driving mechanism controller 50 controls motion of the suction head 31, viz. a transfer motion of the suction head 31 relative to the light sensor 43 during the inspecting operation. A display section 51 exhibits the variation in the amount of light received in the light detector 43*b* in terms of a wave form. A control section 52 controls the whole operation of mounting the conductive ball 2. Besides the above control functions, it reads a wave form stored in the read-out wave form memory 48 and a reference wave form stored in the reference wave form memory 49, compares and subtracts these wave forms in order to judge whether or not the conductive ball 2 is existing on the bottom surface of suction head 31.

Figure 3:
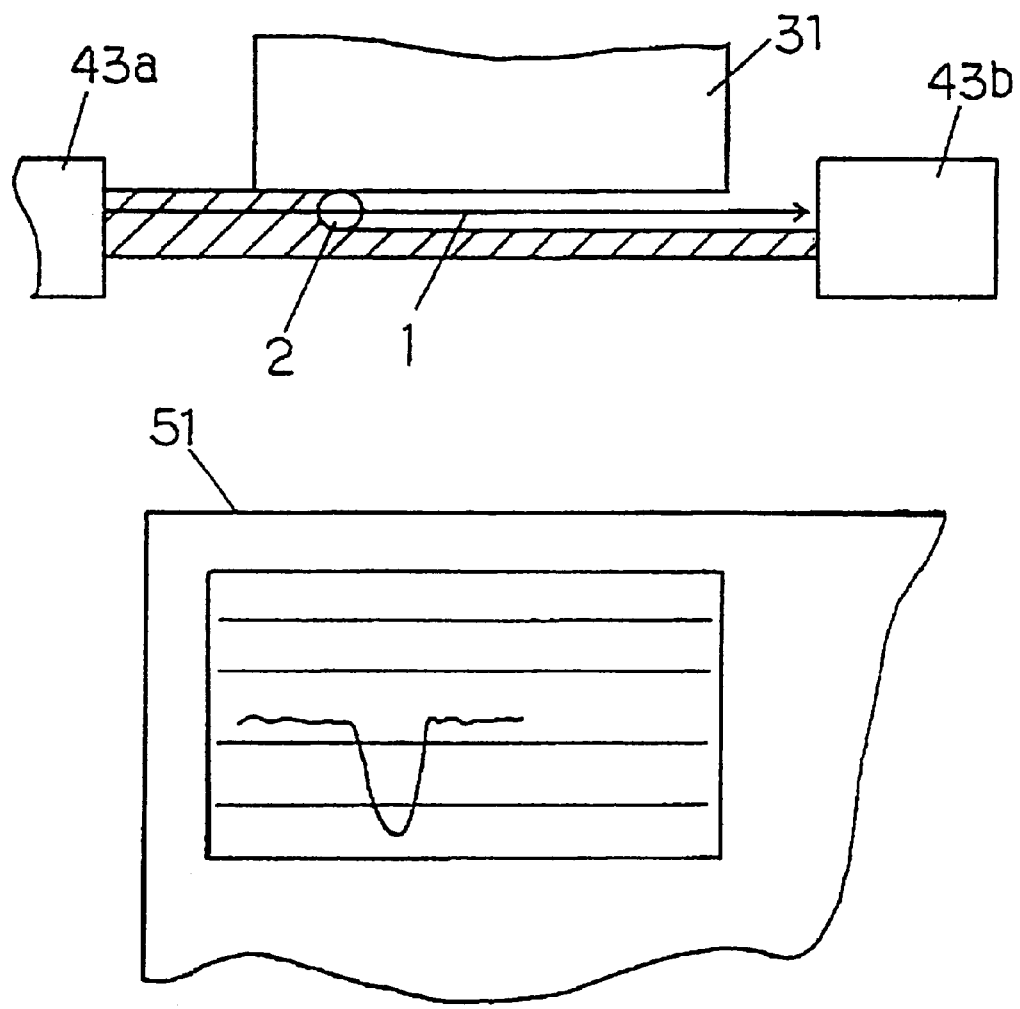
FIG. 3 shows a partial magnification of the inspecting section.

Now, the detection of conductive ball 2 by the light sensor 43 is described with reference to FIG. 3 and FIG. 4. In FIG. 3, there is a conductive ball 2 sticking no the bottom surface of suction head 31. The conductive ball 2 is in a location interrupting a laser beam projected from the light source 43*a*. The laser beam projected from light source 43*a* is detected by the light detector 43*b*. The light detector 43*b* delivers electric signal in accordance with the strength of the light received. When a conductive ball 2 is located in the optical axis 1 interrupting the laser beam from light source 43*a*, the electric signal to be delivered from the light detector 43*b* is weaker in proportion to the degree of interruption, as compared with a case where there is nothing to interrupt on the optical axis 1.

When the suction head 31 is moved in a horizontal direction (vertical to the drawing), electric signal from light detector 43*b* displayed in the display section 51 as a wave form exhibits a valley shape every time when a conductive ball 2 sticking on the bottom surface of suction head passes across the optical axis 1, as shown in FIG. 3. The passing of the conductive ball 2 across the optical axis 1 can be eye-witnessed on the screen of display section 51 as the valley emerging in the wave form. An automatic inspection as to the existence, or non-existence, of conductive ball 2 on the bottom surface of suction head 31 can be realized through an analysis of the wave form at the control section 52.

With the above described method, however, it is difficult to perform an exact detection as to whether a conductive ball 2 exists or not, in such a case where there is a tilt in the bottom surface of suction head 31 relative to the optical axis 1, or the height of conductive balls 2 being sucked to on the suction head 31 is dispersed because of a dispersion in the accuracy of machining for making the suction holes 31*a*. A method of detecting the conductive ball 2 by making use of the wave form displayed in the display section 51 is described in the following.

Figure 4A:
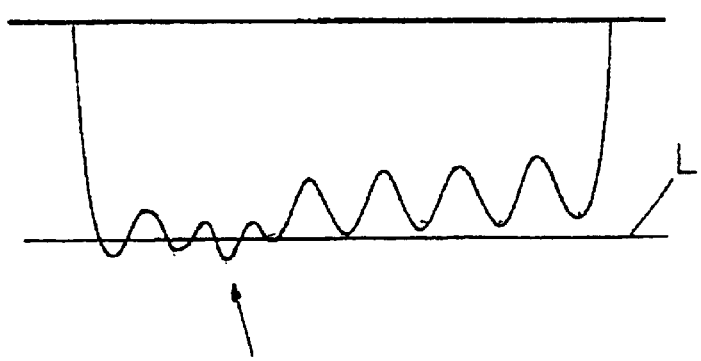
Figure 4B:
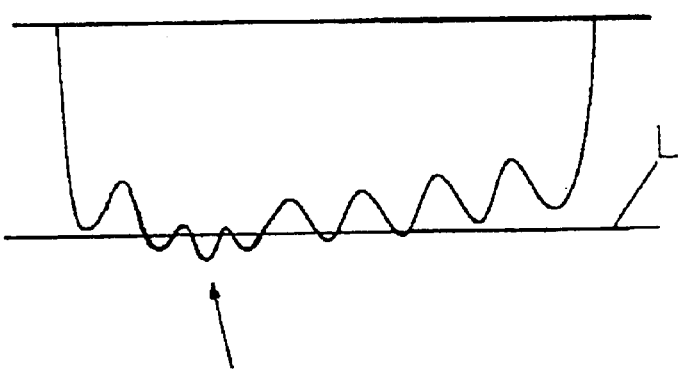

FIG. 4(*a*) shows a wave form detected at the light detector 43*b* when there is a redundant conductive ball 2 sticking on the bottom surface of suction head 31, with the bottom surface of suction head 31 being tilted. FIG. 4(*b*) shows a wave form detected at the light detector 43*b* when there is a redundant conductive ball 2 sticking on the bottom surface of suction head 31, with the height of the conductive balls dispersing due to machining errors during processing of the suction holes 31*a*. In both of the above cases, a wave form representing the redundant conductive ball 2 (indicated by an arrow mark in the drawing) is overlapped on a wave form representing the conductive balls 2 being rightly sucked to in the respective suction holes 31*a*.

If the wave forms as they are were simply compared with the threshold value L for the judgement as to the existence of the conductive ball 2, an erroneous judgement may come up that there are some parts void of the conductive ball 2, although in reality the conductive balls 2 are being sucked to rightly. As it is evident from the FIG. 4(*a*) and FIG. 4(*b*), the straight line threshold value level L can not be a right tool for yielding a correct judgement, in the cases where the suction head 31 is tilted or the height of conductive balls 2 is dispersed because of machining errors during processing of the suction holes 31*a*.

Figure 5A:
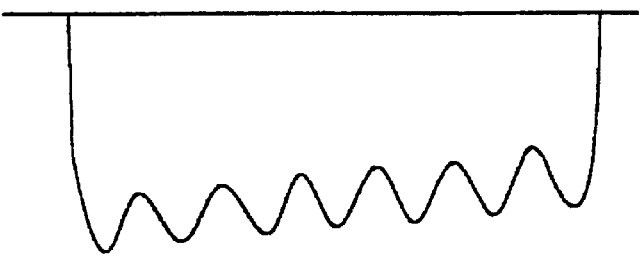
Figure 5B:
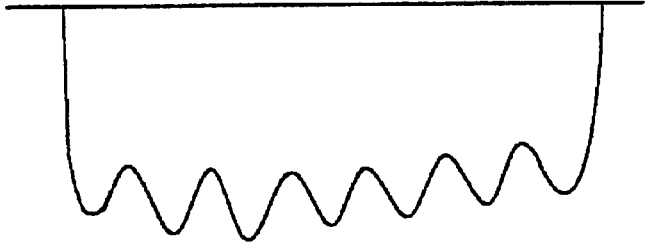

Through the following procedure, the influences brought about by a tilted suction head 31 and the machining errors during processing of suction holes 31*a* may be eliminated. FIG. 5(*a*) shows a wave form where all of the suction holes 31*a* of suction head 31 are sucking the conductive balls 2 without more then one ball per hole on the suction head, with the bottom surface of suction head 31 being tilted. FIG. 5(*b*) shows a wave form where the conductive balls 2 are likewise sucked without more than one ball per hole on the suction head, while wave forms representing the conductive balls 2 are dispersing reflecting the machining errors in the processing of suction holes 31*a*. These wave forms are the wave forms to be exhibited when the conductive balls 2 are rightly sucked to, or the first reference wave form. In other words, these first reference wave forms may be considered as those that contain the bias components stemming from said tilted suction head 31 and the machining errors in suction holes 31*a*.

In an actual mounting operation of the mounting apparatus, a first stage inspection, where a redundant conductive ball 2 is sticking on the bottom surface of suction head 31 or not is inspected, is conducted by comparing a read-out wave form obtained at light detector 43*b* (FIG. 4(*a*), FIG. 4(*b*)) with said first reference wave form. Practically, said first reference wave form (FIG. 4(*a*), FIG. 4(*b*)) is subtracted from the read-out wave form to arithmetically remove the bias components. The wave forms thus obtained are shown in FIG. 6(*a*), FIG. 6(*b*). Through the above described calculation, bias components due to the tilting suction head 31 and the machining errors at suction holes 31*a* are removed, and a simple wave form is displayed where only a shape that indicates a redundant conductive ball 2 sticking to the suction head is exhibited, A second stage inspection, at which stage if there is any conductive ball 2 remaining stuck on the bottom surface of suction head 31 after the mounting of conductive balls 2 is finished is inspected, is conducted in a same operation as described above. Namely, a second reference wave form obtained at the light detector 43*b* (FIG. 7) representing a state where there is no conductive ball 2 at all on the suction head is stored in a memory, which is then subtracted from a second read-out wave form (FIG. 8) to be obtained after mounting of the conductive balls 2 is finished. Thus the influence of the tilted suction head 31 is removed, and a simple wave form as shown in FIG. 9 is obtained where only an indication of a conductive ball 2 remaining on the bottom surface of suction head 31 is exhibited.

As described in the above, a wave form detected at the light detector 43b representing a state where the conductive balls 2 are rightly sucked to by the suction head 31 and that representing a state where there is no conductive ball 2 at all on the suction head 31 are put into memory as a first reference wave form and a second reference wave form, respectively. When inspecting whether there is a conductive ball 2 or not, the first reference wave form and the second wave form are compared respectively to a first read-out wave form and a second read-out wave form to be obtained at each inspection stage. In this way, the existence, or non-existence, of the conductive ball 2 is detected at a high accuracy level, eliminating the influence of tilted suction head 31 and other bias components.

Now in the following, the operation of a conductive ball mounting apparatus structured as above is described. Referring to FIG. 1, a suction head 31 is transferred to a place above a ball feeder 10 by an X-axis motor 23. The suction head 31 is lowered by a Z-axis motor 27 until the bottom surface of suction head 31 slightly sinks into a layer of the conductive balls 2. A nozzle 14 provided at the bottom of ball vessel 11 is blowing a gas upward (see arrow marks 3); thereby, the conductive balls 2 have been mobilized by the gas flow. The conductive ball 2 blown upward is sucked to a suction hole 31a of suction head 31 by vacuum.

At this stage, the suction head 31 may sometimes go up carrying a redundant conductive ball at a place other than the suction hole 31a in the bottom surface, as shown in FIG. 10. In order to prevent the redundant conductive ball 2 from being carried by the suction head 31 as far as the stage for mounting operation, an inspecting section 40 inspects as to whether there is a redundant conductive ball 2 sticking. The suction head 31 carrying the conductive ball 2 is moved to a place above the inspecting section 40, and then lowered so as the conductive balls 2 being sucked to the bottom surface of suction head comes down to a level of a light axis 1 shown in FIG. 2.

While the suction head 31 is moved at a certain fixed speed in a horizontal direction a laser beam is projected on from a light source 43a. The amount of laser beam received in a light detector 43b varies depending on whether there is a conductive ball 2 or not. Electric signal representing a variation in the amount detected is A/D converted to be stored as a first read-out wave form in a read-out wave form memory 48. The first read-out wave firm thus stored is compared with a first reference wave form previously stored in a reference wave form memory 49, in order to make a judgement as to whether the conductive ball 2 exists or not through a subtractive calculation in a control section 52

As soon as a redundant conductive ball 2 is detected sticking on the bottom surface of suction head 31, the operation of mounting apparatus is discontinued, and operating staff is notified of the situation. The operator may either remove the redundant conductive ball 2 by himself, or return the suction head 31 to the ball feeder 10 for repeating the sucking operation after once releasing the vacuum.

After the redundant conductive ball 2 is removed and each of the suction holes 31a is provided rightly with one conductive ball 2 by vacuum suction, the suction head 31 makes a horizontal motion to proceed to a place of location setting table 5. The suction head 31 goes down on a workpiece 9 held by a holder 8, then the conductive ball 2 is released from vacuum to be mounted on the workpiece 9. The suction head 31 goes up. This completes an operation for mounting the conductive ball 2.

The suction head 31 returns to the inspecting section 40 to be inspected. There, the suction head 31 is inspected in a same procedure as in the inspection for a redundant conductive ball, as to whether there is any conductive ball 2 remaining stuck on the bottom surface of suction head 31 after having finished the mounting operation of conductive balls onto the workpiece 9. Namely, a second read-out wave form obtained is compared with a second reference wave form, and a control section 52 judges through a subtractive calculation as to whether there is a conductive ball 2, or not. If any one of the conductive balls 2 is detected to have been remaining there in the present inspection, a warning is issued notifying a placing error. The relevant workpiece undergoes a repair process, or other salvation means is provided.

(Embodiment 2)

A mounting apparatus in accordance with a second exemplary embodiment of the present invention is described below referring to the drawings FIG. 11 through FIG. 18.

Figure 11:
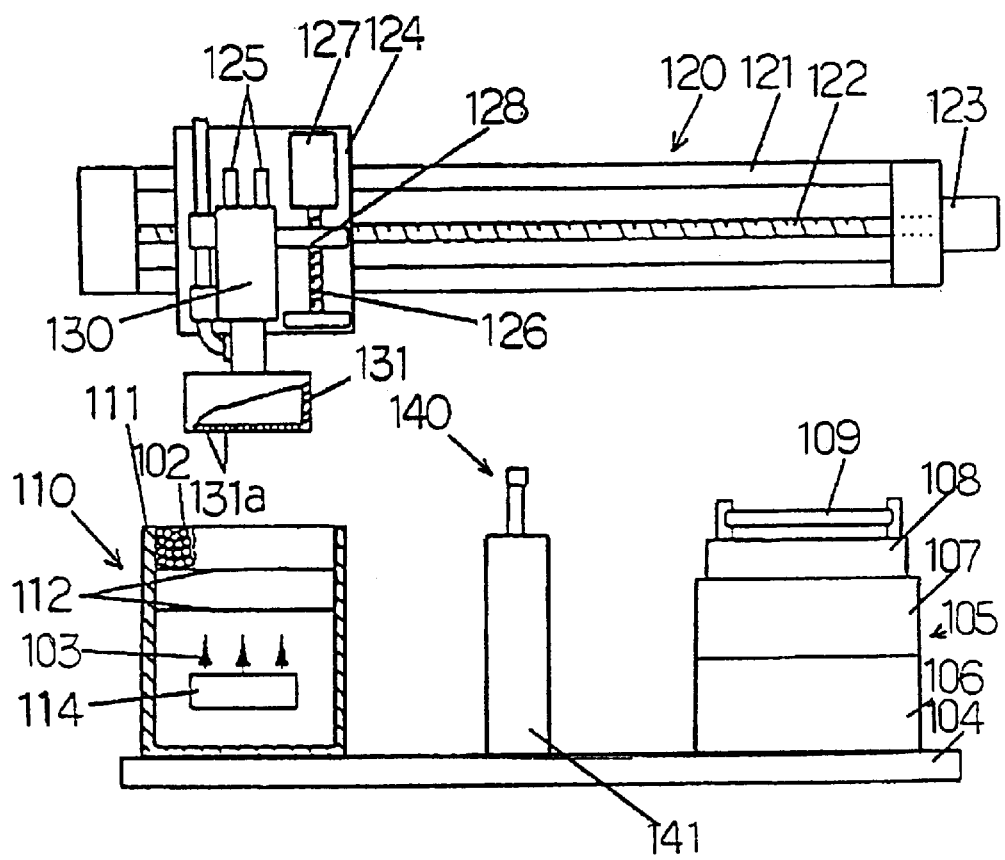
FIG. 11 is a front view of a conductive ball mounting apparatus in accordance with a second exemplary embodiment of the present invention.

In the first place, an overall structure of the conductive ball mounting apparatus is described with reference to FIG. 11. A location setting table 105 is provided on a machine bed 104 as means for determining location. The location setting table 105 is formed of a Y table 106 and an X table 107. A holder 108 is provided on the X table 107 for holding a workpiece 109. The location of workpiece 109 is determined by moving the location setting table 105. The means for determining location may be constituted instead by providing a table for holding the workpiece 109 as the fixed member and moving a suction head, to be described later, on a horizontal plane in X and Y directions relative to the workpiece 109.

A ball feeder 110 for feeding conductive balls 102 is provided on the machine bed 104 at an end opposite to the location setting table 105. The ball feeder 110 is consisted of a ball vessel 111; within which vessel 111, a mesh plate 112 is provided horizontally in plural layers. The mesh plate 112 is provided with a great many number of through holes, the size of the through hole not allowing the conductive ball 102 to pass through. The conductive balls 102 are stored on the uppermost layer of mesh plate 112. At the bottom of the ball vessel 111, a nozzle 114 is provided, which nozzle is coupled with a gas supply source (not shown).

By supplying a gas to the nozzle 114, the conductive balls 102 are agitated to get a mobility by the gas blown upward from the nozzle 114 and reaching the layer of conductive balls 102 passing through the through holes of mesh plate 112.

Description is made on a suction head 131 on which the conductive ball 102 is loaded. In FIG. 11, a transfer device 120 moves the suction head 131 for a span between the ball feeder 110 and the location setting table 105. The suction head 131 is held by a block 130. In the bottom of suction head 131 are a plurality of suction holes 131a. The block 130 is attached to be freely movable ups and downs on to a vertical guide rail 125 provided in the front face of a bracket 124.

The block 130 is provided with a nut 128 made integrally together, which nut is engaged with a vertical screw bolt 126. So, if the screw bolt 126 is revolved in a forward, or reverse, direction as the result of forward, or reverse, revolution of a Z-axis motor 127, the suction head 131 makes up-down movement guided by the guide rail 125. Thus the Z-axis motor 127 and the screw bolt 126 constitute means for moving the suction head 131 ups and downs.

The bracket 124 is provided with a nut (not shown) in the opposite face, which nut is engaged with a horizontal screw bolt 122 which is supported by a holding table 121. So, if the screw bolt 122 is revolved in a forward, or reverse, direction as the result of forward, or reverse, revolution of an X-axis motor 123, the suction head 131 held by the bracket 124 makes a horizontal movement in a span between the location setting table 105 and the ball feeder 110.

An inspecting section 140 is provided on the machine bed 104 at a side of the ball feeder 110, ref. FIG. 11. The inspecting section 140 inspects whether or not there is a redundant conductive ball 102 sticking on the bottom surface of suction head 131, and whether or not there is a conductive ball 102 still remaining on the bottom surface of suction head 131 after the mounting operation is finished.

The system structure of the inspecting section 140 and control system is described below referring to FIG. 12. A sensor bracket 142 is provided on the machine bed 141, at both ends of the bracket 142 are a light source 143a of an interruption type light sensor 143 and a light detector 143b of the light sensor 43, respectively.

Now, the detection of a conductive ball 102 by the light sensor 143 is described. In FIG. 12, there is a conductive ball 102 sticking to the bottom surface of suction head 131. The conductive ball 102 is in a location interrupting a laser beam projected from the light source 143a of inspecting section 140. The laser beam projected from light source 143a is detected by the light detector 143b. The light detector 143b delivers electric signal in accordance with the strength of the light received.

Figure 12:
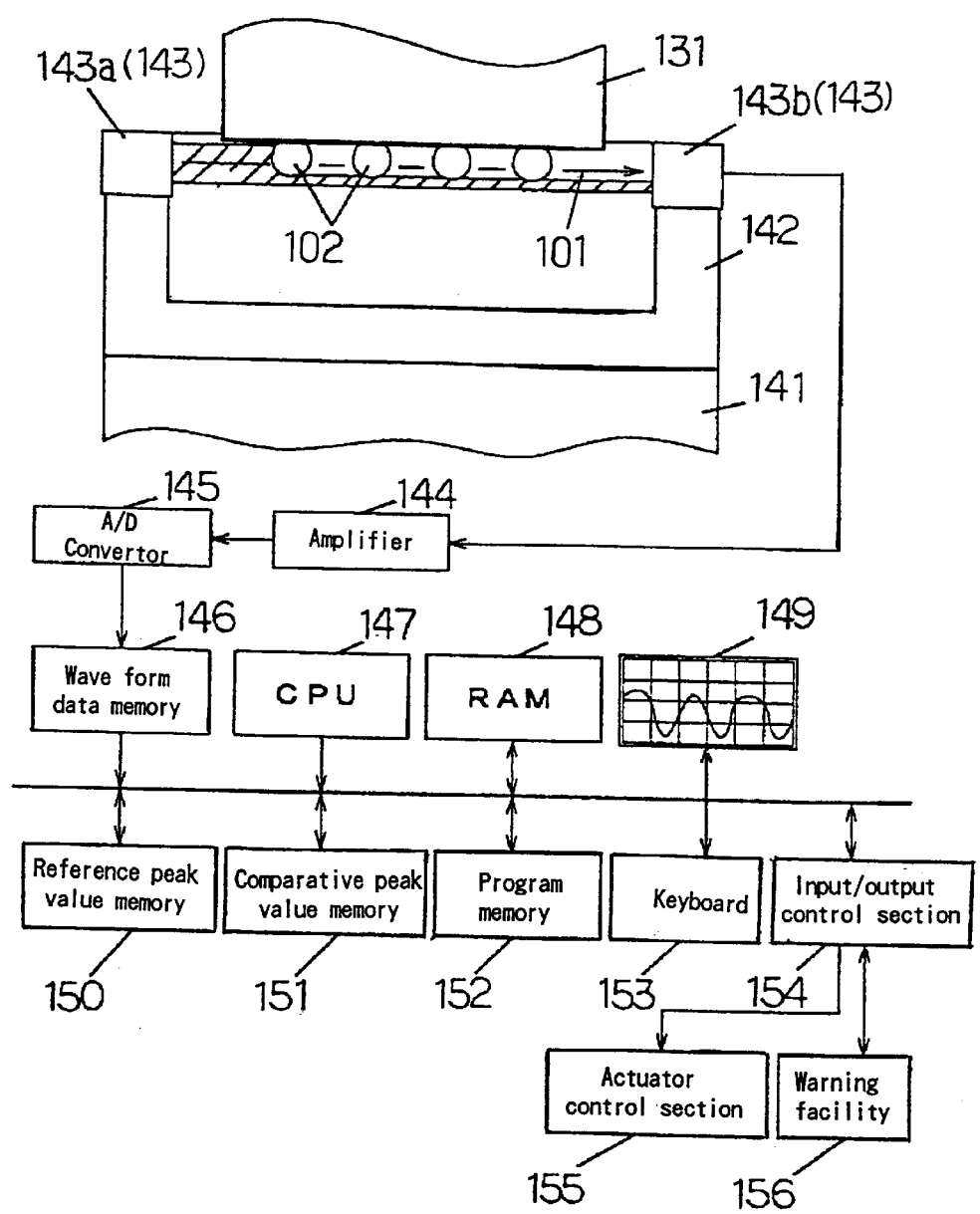
FIG. 12 shows the structure of a control system in the mounting apparatus.

When a conductive ball 102 is in the optical axis 101 interrupting the laser beam from light source 143a, as shown in FIG. 12, electric signal to be delivered from the light detector 143b is weaker in proportion to degree of the interruption, as compared with a case where there is nothing to interrupt on the optical axis 101

When the suction head 131 is moved in a horizontal direction (vertical to the drawing) the electric signal from light detector 143b displayed as a wave form exhibits a valley shape in a monitor 149 of FIG. 12 every time when a conductive ball 102 sticking on the bottom surface of suction head 131 passes across the optical axis 101. Therefore, passing of the conductive ball 102 across the optical axis 101 can be eye-witnessed by observing the screen of monitor 149. An automatic inspection as to the existence of conductive ball 102 on the bottom surface of suction head 131 can be made through an analysis of the wave form data in a system to be described below.

Wave form signal delivered from the light detector 143b is amplified by an amplifier 144, and then A/D converted by an A/D converter 145 to be stored in a wave form data memory 146 as digital wave form signal. A control section, or a CPU, 147 conducts a calculation to obtain a peak of the wave form from a wave form data, as well as a processing for judging the existence, or non-existence, of the conductive ball 102 by comparing the peak value data of a reference wave form, to be described later, with a peak value data of wave form detected when actually mounting the conductive ball.

RAM 148 stores data of said processing and other calculations. Monitor 149 displays operational instructions, inspection wave forms of conductive balls, etc. A reference peak value memory 150 stores peak value data of reference wave form detected when the suction head 131 is rightly sucking the conductive ball 102. A comparative peak value memory 151 stores peak value data of wave form detected when actually mounting the conductive ball. A program memory 152 stores programs for mounting operation of the conductive ball, judgement of sucking status, peak detection, etc.

A keyboard 153 is for inputting various data and commands on operating instructions. An input/output control section 154 is an interface for data exchange, taking part of data exchange among an actuator control section 155, which controls motors, cylinders and other actuators of various moving sections, and a warning facility 156 such as warning lamp, buzzer, etc.

Figure 13:
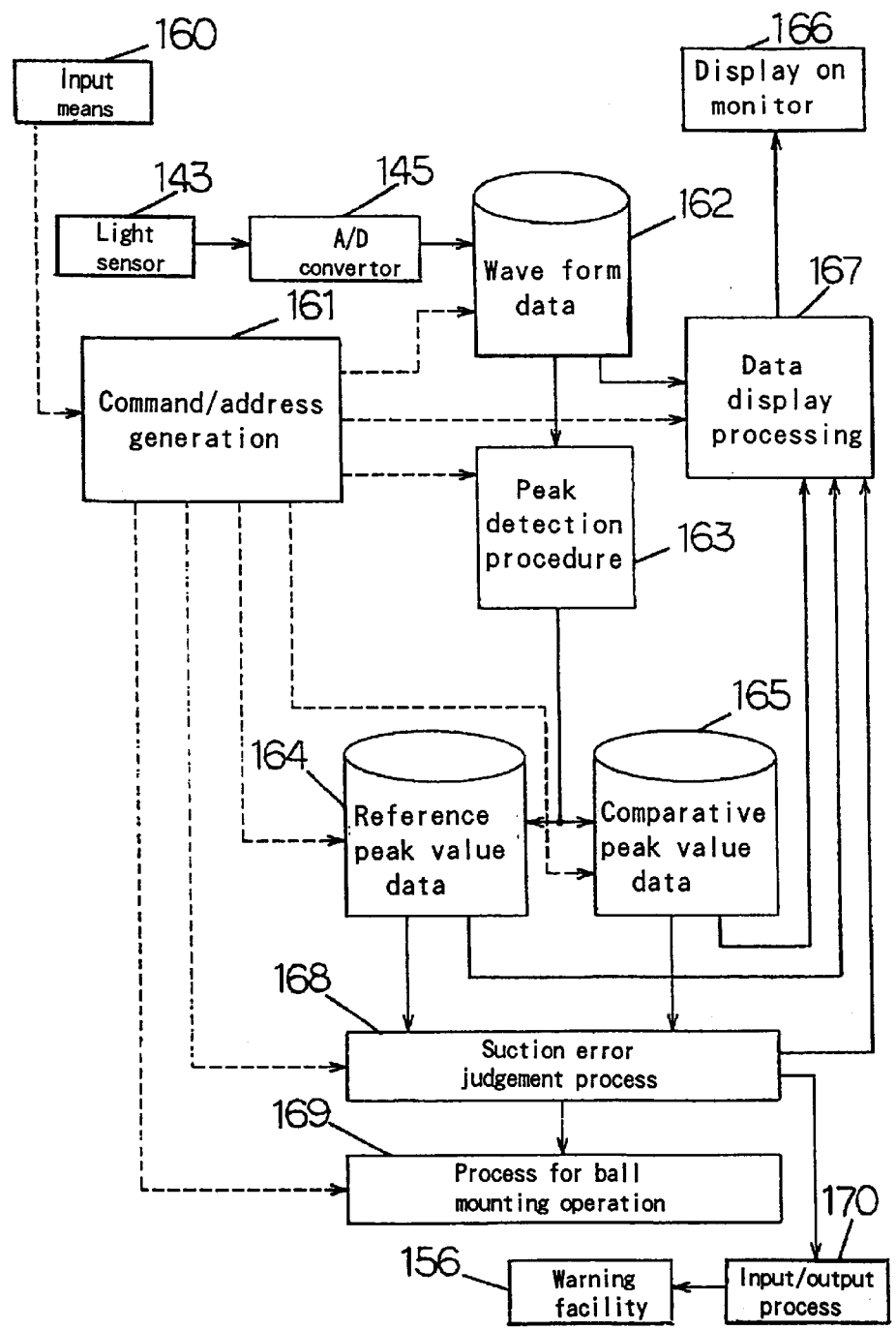
FIG. 13 is a block diagram showing how the control is processed in the mounting apparatus.
Figure 14:
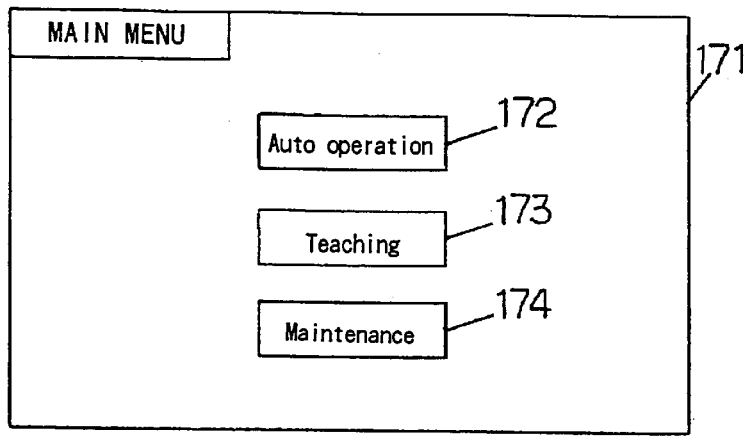
FIG. 14(a), FIG. 14(b), FIG. 14(c) are operating instructions that appear in a display screen of the mounting apparatus.
Figure 14:
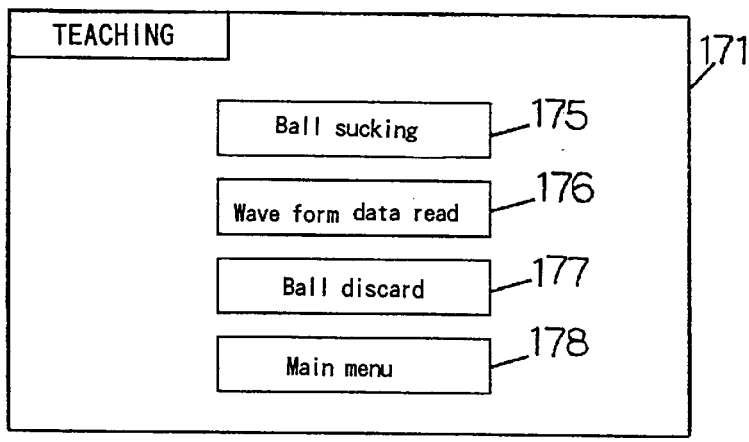
Figure 14:
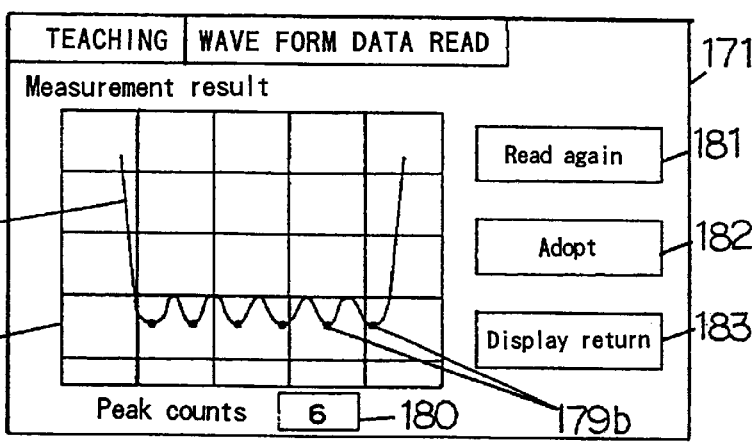
Figure 15:
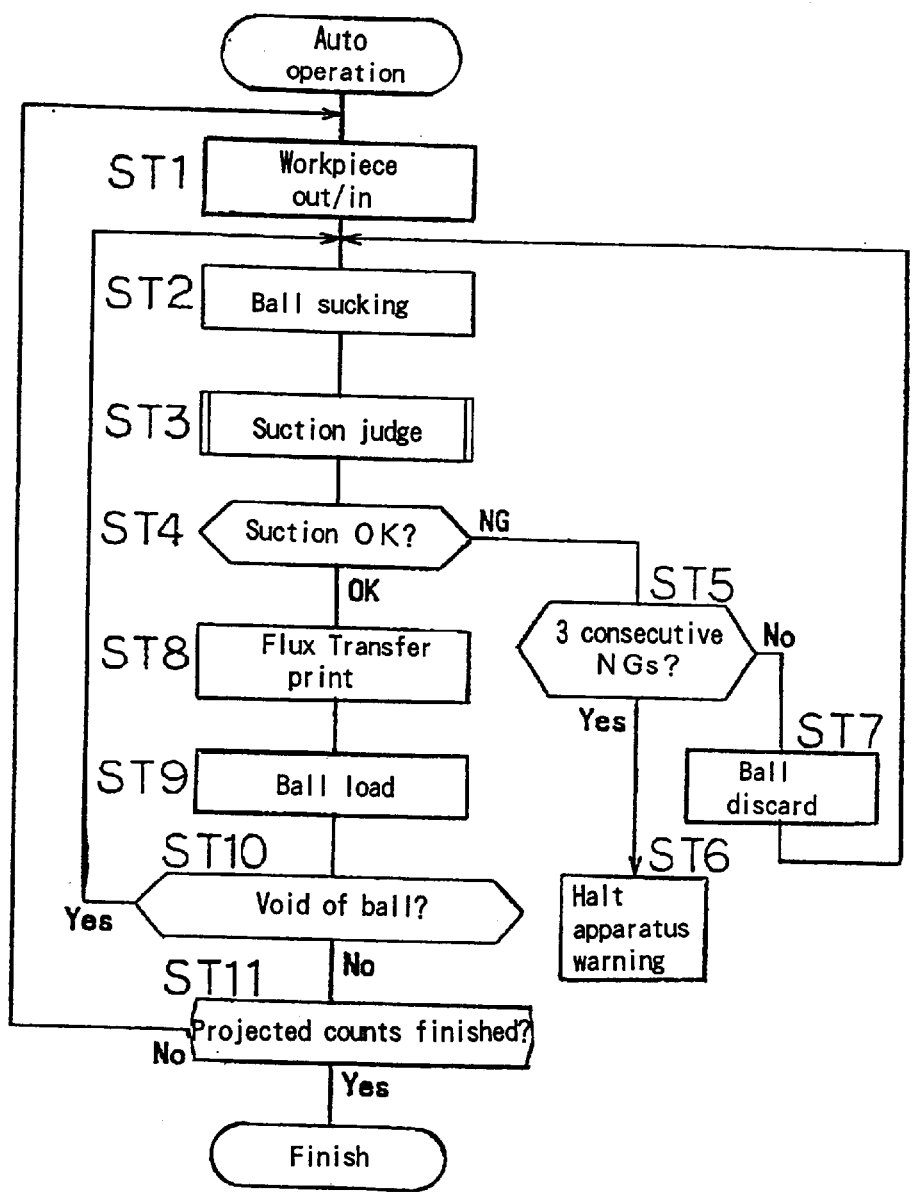
FIG. 15 is an operating flow chart of the mounting apparatus.

Process flow is described below with reference to FIG. 13. In FIG. 13, arrow mark of solid line indicates flow of data, that of dotted line indicates the flow of command/address, etc. Upon receiving operational instructions from the keyboard 153 or other input means 160, a command/address generation 161 delivers processing commands and delivery address of various data, as shown with arrow marks of dotted lines in FIG. 13.

Signal from the light sensor 143 is A/D converted by an A/D converter 145 to be stored as wave form data 162. Then, a peak detection procedure 163 follows, where a peak of the wave form is detected out of the wave form data 162. The result of peak detection at teaching operation is stored as a reference peak value data 164, while the result of peak detection at actual mounting of conductive ball is stored as a reference peak value data 165. These wave form data 162, reference peak value data 164 and comparative peak value data 165 are displayed 166, after undergoing a data display processing 167, on the monitor 149 in the form of a wave form, or a peak point designated on the wave form.

In the actual mounting operation, the reference peak value data 164 and the comparative peak value data 165 are compared by the CPU 147 for conducting a suction error judgement process 168 which detects the existence, or non-existence, of the conductive ball. The result of judgement is notified, after an input/output processing 170, through the warning facility 156 such as a buzzer, a warning lamp, etc. In accordance with the result of suction error judgement process 168, a process for ball mounting operation 169 is put in force for performing predetermined actions for either the normal state or the abnormal state.

The above described teaching operation is described below referring to monitor displays 149 that appear during operation of a conductive ball mounting. The teaching is for reading a wave form representing a state where the suction head 131 is sucking the conductive ball 102 rightly in the normal state. The teaching operation is required to be done when a suction head 131 is replaced for a type change, or the like occasion.

FIG. 14(a) is a screen 171 where a main menu is being displayed for selection among the three; Automatic operation 172, Teaching 173 and Maintenance 174. If the Teaching 173 is selected, display of the Teaching as shown in FIG. 14(b) appears on the screen; Ball sucking 175, Wave form data read 176, Ball discard 177 and Main menu 178, for selection. If the Ball sucking 175 is selected, the suction head 131 sucks the conductive ball 102 up from ball feeder 110. After confirming that the suction head 131 is rightly sucking the conductive ball, select the Wave form data read 176. Then, the Wave form data read is displayed on the screen, as shown in FIG. 14(c). A wave form graph 179a appears in a screen 179 to exhibit wave forms. After observing the shape of the wave form graph 179a, a judgement is made as to whether or not the read-in wave form data is normal and can be used as a reference wave form.

If the judgement indicates that it is inappropriate to use the wave form as reference wave form, then the Read again 181 is selected. The operation of reading the wave form is repeated while moving the suction head 131 relative the light sensor 143. If it is judged to be usable as a reference wave form, the Adopt 182 is selected, and the displayed wave form data is stored in the wave form memory 146. And then, a peak detection program (to be described later) is entered; the peak value data thus detected is stored in the reference peak value memory 150, and a point indicating the peak 179b is shown in a wave form graph 179a, at the same time the number of peak counts 180 is also displayed.

If the Display return 183 is selected, the display returns to the FIG. 14(b) screen. By selecting the Ball discard 177 the conductive ball 102 being sucked to the sucking head 131 for the purpose of teaching is discarded. Selection of the Main menu 178 makes an automatic operation to be ready.

The operation of a conductive ball mounting apparatus structured as above is described with reference to FIG. 16, where the flow of automatic operation is shown. First, referring to FIG. 15, a new workpiece 109 is installed on a location setting table 105 and held firm by a holder 108 (ST1). A suction head 131 sucks conductive ball 102 stored 30 in a ball feeder 110 up (ST2), and. then moves to an inspecting section 140 to receive a judgement as to the state of the conductive balls 102 being sucked to (ST3). Details of the judgement will be described later. The state of sucking is judged in this stage (ST4); if judged to be OK it proceeds to the steps ST8 (to be described later) and further, if judged to be NG the following process is entered.

Whether the NG occurred for three times consecutively is judged (ST5); if YES such a state is judged to be unusual and the operation of the apparatus is halted with a notification (ST6). If the occurrence of NG is less than three consecutive times, the suction head 131 is moved to other location and the sucked conductive balls 102 are discarded (ST7), and then returned to the ST2 to suck the conductive ball 102 again.

If the state of sucking is judged to be normal at the ST4, the suction head 131 goes down onto a flux applicator (not shown) to have the flux transfer-printed on the conductive ball 102 (ST8). Then the suction head 131 moves to a place above the location setting table 105, and goes down to be close to the workpiece 109. The sucking vacuum is released, and the conductive ball 102 is mounted on the workpiece 109 (ST9).

At a stage ST10, a judgement is made as to whether there is any point on the workpiece 109 lacking the conductive ball 102. If such point void of the conductive ball 102 is detected, it returns to the stage ST2 for repeating the steps of sucking the conductive ball 102 and further. At a stage ST11, whether processing on the workpieces of a same type is finished for a projected quantity is judged. If the processing is not completed for the projected quantity, a series of the steps ST1 and further is repeated on the remaining workpieces 109. If a projected quantity is found to have been fulfilled, the operation for mounting the conductive ball 102 is finished.

Figure 16:
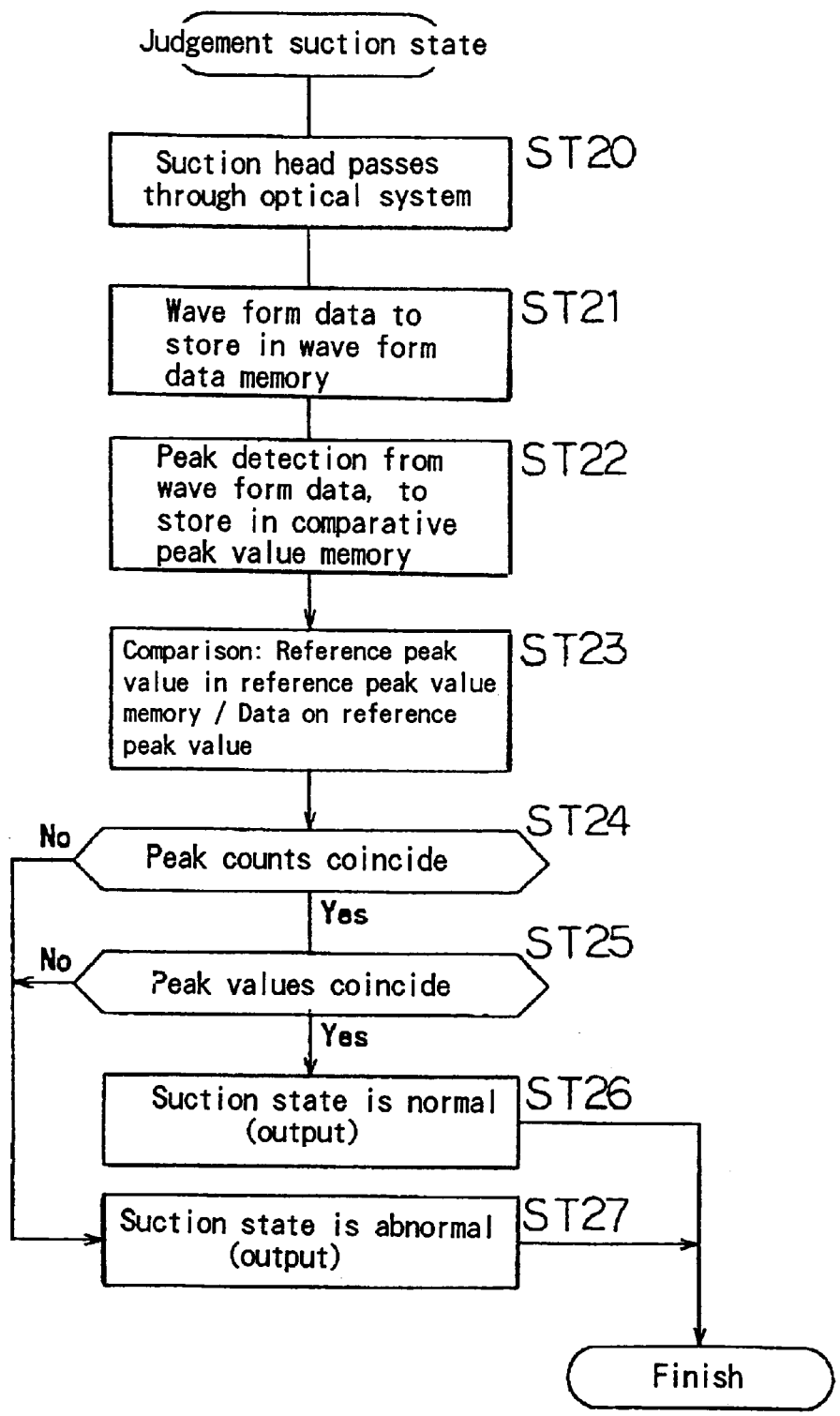
FIG. 16 is a flow chart showing how a state of sucking is judged in the mounting apparatus.

Now referring to FIG. 16, description is made on the earlier-mentioned judgement about the state of suction conducted at the stage ST3. The suction head 131 carrying the conductive ball 102 passes through an optical system formed between a light source 143a and a light detector 143b of a light sensor 143 (ST20). A wave form data obtained is stored in a wave form data memory 146 (ST21). A peak detection program (to be described later) for detecting the peak of each wave form in the wave form data is entered, and the data on the detected peak value is stored in a comparative peak value memory 151 (ST22).

The reference peak value stored in reference peak value memory 150 is compared with data on comparative peak value in the following procedure (ST23). Namely, the judgement is made as to whether the number of peaks detected in the respective wave form coincide or not (ST24), and whether the corresponding peak values coincide or not (ST25). At the ST25, if the difference between the corresponding peak values falls within a certain specific range, the peak values are judged to be coincidental. If both the peak counts and the peak values are coincidental, an output indicating that the state of suction is normal is delivered (ST26); if either one among the peak counts and the peak values is not coincidental, the output tells that the state of suction is not normal.

A peak detection program is described in the following referring to FIG. 17 and FIG. 18. FIG. 18 is a wave form graph obtained by continuously recording a signal (voltage value) of light amount detected at the light detector 143b of light sensor 143. The higher the voltage value of the wave form graph, or when the amount of light received is large, the lower the degree of interruption of the optical axis with the conductive ball 102. Which indicates that the conductive ball 102 is located off the optical axis.

The cross point of the vertical line, which divides one wave form into n portions, and the graph line represents a unit wave form data V(i), for numerically handling the wave form graph. The voltage level Vth is a threshold voltage; a detected unit wave form data V(i) is regarded effective only when it is smaller than the voltage level Vth.

Figure 17:
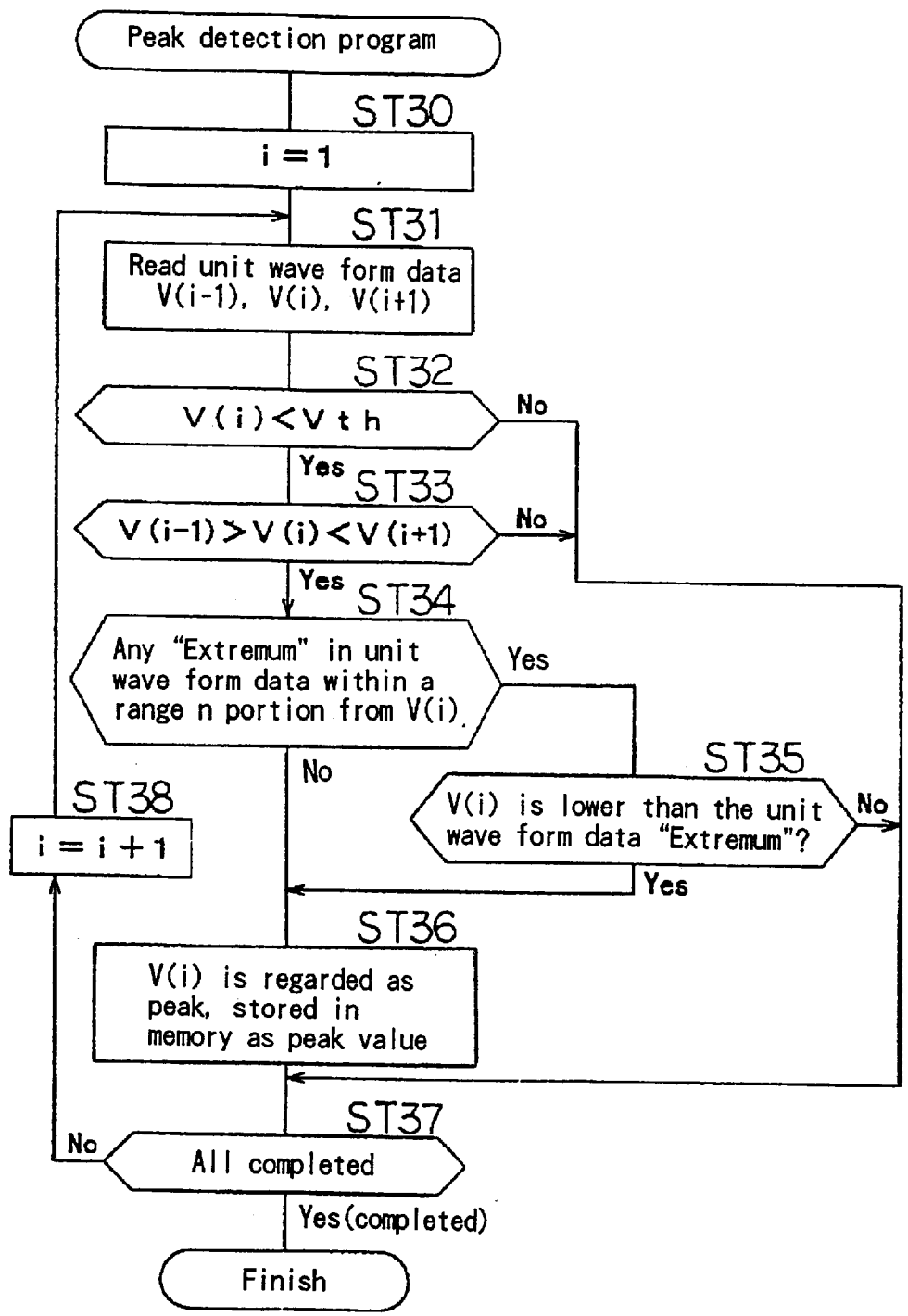
FIG. 17 is a flow chart showing a peak detection program in the mounting apparatus.
Figure 18:
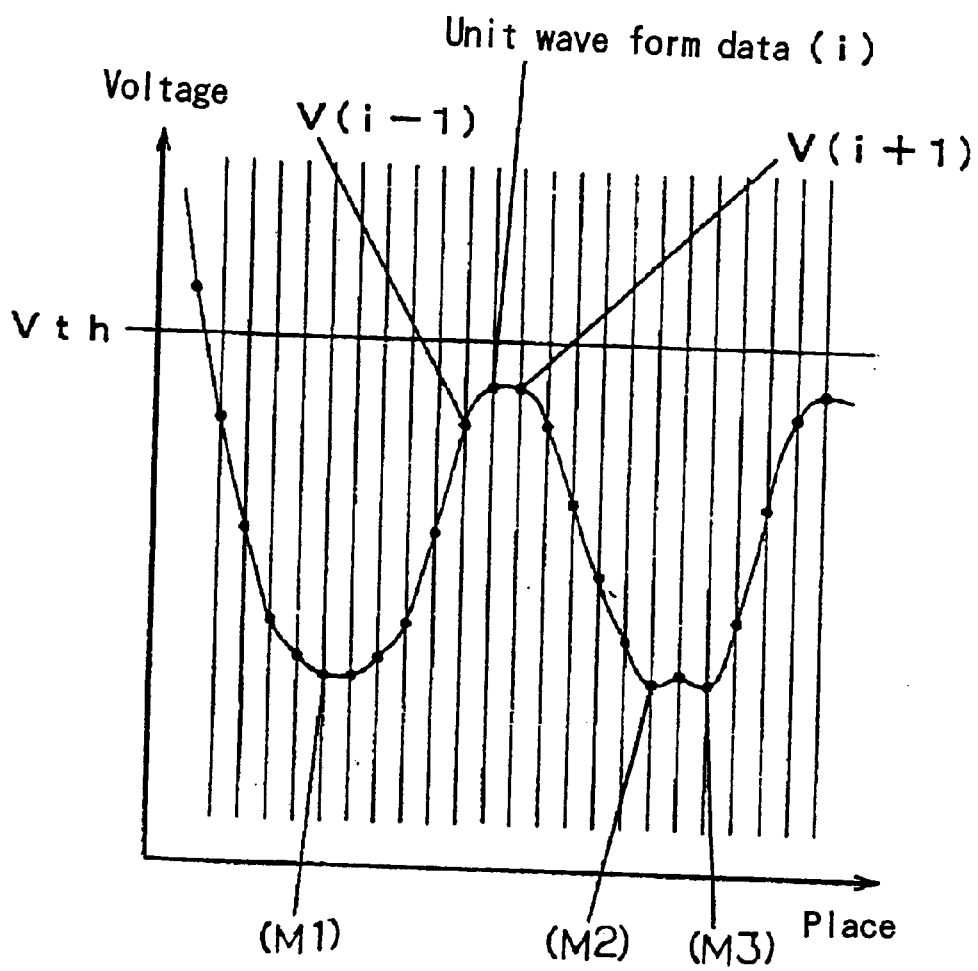
FIG. 18 shows an inspection wave form in the mounting apparatus.

In FIG. 17, index i of the unit wave form data is first set to 1 (ST30). The three consecutive unit wave form data, V(−1), V(i), V(i +1), are read-out (ST31). Then, whether these data values are effective or not is judged, viz. whether a formula V(i) <Vth is fulfilled or not is judged. If it is judged to be not effective, the data is abandoned and proceeds to a step ST37, to be referred to later. If all of the data are judged to be effective, then the middle unit wave form data V(i), among the three consecutive data, is judged if it is lower than any of the unit wave form data, V(−1) and V(i+1), locating at both sides (ST33). Namely, the V(i) is judged whether it is the extremum. If it is not the extremum, then proceeds to a step ST37 to have the 1 added to the index i (ST38), and then returned to the step ST31 for reading the data again.

If the V(i) is judged to be the extremum (ref the extremum (M1) in FIG. 18), then the next judgement is made as to whether or not there are a plurality of extrema within a range of one wave form. Namely, whether there is any point that has been judged to be the extremum existing in a unit wave form data within a range n portions from the V(i) is judged (ST34). When there is no such extremum found within the range, the V(i) meeting the ST33 requirements is treated as the peak of the relevant wave form and stored in a specified memory as peak value.

If judgement at the ST34 tells that there are a plurality of extrema within a range of one wave form (ref. the extremum (M2), (M3)), it undergoes a next judgement as to whether the V(i) is lower than the unit wave form data that has already been judged to be the extremum (ST35). If the V(i) is lower than the above described other extremum, then it proceeds to a step ST36 and the V(i) is treated as peak value. If the V(i) is higher than the other extremum, it is not regarded as peak value, and proceeds to a step ST37. When all of the data went through the above described processing, the peak detection flow is finished.

In the present embodiment, the conductive ball 102 being sucked to the bottom surface of suction head 131 is moved in a direction perpendicular to the optical axis of an interrupting type light sensor 143, and the amount of light received in a light detector 143*b* of the light sensor 143 is continuously measured to obtain a wave form. The existence, or non-existence, of the conductive ball 102 is detected based on the wave form data. Data on the peak value of reference wave form obtained when the conductive ball 102 is rightly sucked to is compared with data on the peak value of wave form obtained when mounting the conductive ball 102; in practice, by judging the coincidence in the number of detected peak value counts and the corresponding peak values, the existence, or non-existence, of the conductive ball 102 is detected. Therefore, even if there are some errors in the fabrication of suction head 131, or machining errors in the processing of suction holes, for example, the resultant errors in interrupting the light is eliminated. So, whether the conductive ball 102 exists or not is detected at a high accuracy level Although the present invention has been described in terms of the presently preferred embodiments, it is to be understood that such disclosure is not to be interpreted as limiting. Various alterations and modifications will no doubt become apparent to those skilled in the art after having read the above disclosure. For example, although judgement is made based on at combined coincidence of the number of detected peak value counts and the corresponding peak values in the second exemplary embodiment, the judgement can be made using the peak counts and the peak values separately. Accordingly, it is intended that the appended claims be interpreted as covering all alterations and modifications as fall within the true spirit and scope of the invention.

What is claimed is:

1. A method of mounting a plurality of conductive balls comprising the steps of:

holding conductive balls on a suction head, said suction head holding said conductive balls in a plurality of holes;

inspecting said suction head for the presence of more than one of said balls per one of said holes by comparing a first waveform with a second waveform, said first waveform is a read-out waveform that represents light detected at a sensor when the suction head is inspected, said second waveform is a reference waveform that represents light detected when the suction head is loaded without more than one conductive ball per hole; and mounting said conductive balls on a workpiece.

2. The method of mounting a plurality of conductive balls according to claim 1, further comprising the step of inspecting said suction head for the presence of remaining conductive balls on the suction head by comparing a third waveform with a fourth waveform, after mounting said conductive balls on said workpiece, wherein said third waveform is a read-out waveform that represents light detected at a sensor when the suction head is inspected, and the fourth waveform is a reference waveform that represents light detected when the suction head is without any held conductive balls.

3. A method of mounting a conductive ball comprising the steps of:

holding conductive balls on a suction head, said suction head holding said conductive balls with a plurality of holes;

inspecting said suction head for the presence of more than one of said balls per one of said holes by comparing peak value data from a first waveform with peak value data from a second waveform, said first waveform is a read-out waveform that represents light detected at a sensor when the suction head is inspected, said second waveform is a reference waveform that represents light detected when said suction head is loaded without more than one conductive ball per hole; and mounting said held conductive balls on a workpiece.

\* \* \* \* \*